United States Patent
Kim et al.

(10) Patent No.: US 12,382,785 B2
(45) Date of Patent: Aug. 5, 2025

(54) STRETCHABLE DISPLAY DEVICE

(71) Applicant: UIF (University Industry Foundation), Yonsei University, Seoul (KR)

(72) Inventors: Hyun Jae Kim, Seoul (KR); Min Seong Kim, Seoul (KR); Dongwoo Kim, Seoul (KR); Won Kyung Min, Seoul (KR); Dong Hyun Choi, Seoul (KR); Gwan In Kim, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 584 days.

(21) Appl. No.: 17/569,513

(22) Filed: Jan. 6, 2022

(65) Prior Publication Data
US 2022/0231104 A1 Jul. 21, 2022

(30) Foreign Application Priority Data
Jan. 18, 2021 (KR) .......... 10-2021-0006458

(51) Int. Cl.
*H10K 59/121* (2023.01)
*H10K 59/131* (2023.01)
*H10K 77/10* (2023.01)

(52) U.S. Cl.
CPC ....... *H10K 59/1213* (2023.02); *H10K 59/131* (2023.02); *H10K 77/111* (2023.02)

(58) Field of Classification Search
CPC ............ H10K 77/111; H10K 2102/311; H10K 59/1213; H10K 59/131; H10K 59/123;
(Continued)

(56) References Cited

U.S. PATENT DOCUMENTS

2006/0251854 A1 11/2006 Marmaropoulos et al.
2017/0249886 A1* 8/2017 Choi .................... H05K 1/0283
(Continued)

FOREIGN PATENT DOCUMENTS

CN 112259559 A * 1/2021 ......... H01L 27/1218
KR 10-2010-0018006 A 2/2010
(Continued)

OTHER PUBLICATIONS

Myung Sub Lim, et al., "Two-Dimensionally Stretchable Organic Light-Emitting Diode with Elastic Pillar Arrays for Stress Relief", Nano Letters 2020, 20, pp. 1526-1535.

*Primary Examiner* — Britt D Hanley
*Assistant Examiner* — Jason James Greaving
(74) *Attorney, Agent, or Firm* — Park, Kim & Suh, LLC

(57) ABSTRACT

A stretchable display device capable of correcting resolution depending on a stretching degree is disclosed. The stretchable display device includes a stretchable substrate, first light emitting pixels including first light emitting elements arranged spaced apart from each other on the stretchable substrate, deformation switch parts arranged between the first light emitting pixels on the stretchable substrate and stretched and deformed according to stretch of the stretchable substrate, and second light emitting pixels including second light emitting elements arranged between the first light emitting pixels on the stretchable substrate. The second light emitting pixels are controlled to emit light depending on physical deformation of the deformation switch parts.

18 Claims, 14 Drawing Sheets

(58) Field of Classification Search
CPC ............ H10K 71/50; H01H 2203/0085; G09F 9/301; G06F 1/1652
See application file for complete search history.

(56) References Cited

U.S. PATENT DOCUMENTS

| | | | |
|---|---|---|---|
| 2017/0271398 A1* | 9/2017 | Oh | H10D 86/411 |
| 2020/0388784 A1* | 12/2020 | Kim | H10K 50/84 |
| 2022/0261042 A1* | 8/2022 | Hong | H10K 59/40 |

FOREIGN PATENT DOCUMENTS

| | | |
|---|---|---|
| KR | 10-2015-0003308 A | 1/2015 |
| KR | 10-2016-0053358 A | 5/2016 |
| KR | 10-2017-0071549 A | 6/2017 |
| KR | 10-2017-0077097 A | 7/2017 |
| KR | 10-2017-0100719 A | 9/2017 |
| KR | 10-2017-0109179 A | 9/2017 |
| KR | 10-1810050 B1 | 12/2017 |
| KR | 10-2020-0042140 A | 4/2020 |
| KR | 10-2020-0079422 A | 7/2020 |
| KR | 10-2020-0124461 A | 11/2020 |

* cited by examiner

STRETCHABLE DISPLAY DEVICE

STATEMENT REGARDING GOVERNMENT SPONSORED RESEARCH OR DEVELOPMENT

The present invention is derived from research conducted as part of Nano Future Material Source Technology Development (R&D) by Ministry of Science and ICT (Project No.: 1711119795, Project No.: 2020M3H4A1A02084896, Research project name: Biaxial stretch-sensitive AMLED display backplane material/element technology, project management institution: National Research Foundation of Korea, task performing institution: Yonsei University, research period: 2020 Jul. 1.~2021 Dec. 31.). Meanwhile, there is no property interest of the Korean government in any aspect of this invention.

CROSS-REFERENCE TO RELATED APPLICATIONS

A claim for priority under 35 U.S.C. § 119 is made to Korean Patent Application No. 10-2021-0006458 filed on Jan. 18, 2021, in the Korean Intellectual Property Office, the entire contents of which are hereby incorporated by reference.

BACKGROUND

Embodiments of the inventive concept described herein relate to a stretchable display device capable of correcting resolution depending on a stretching degree applied to a stretchable substrate.

A display technology which brings about changes in various form factors has been commercialized from fixed flexible displays such as first-stage curved displays to second-stage rollable and foldable single-axis variable flexible displays. A stretchable display device called a free-form display as a three-stage next-generation form factor innovation display is emerging.

The stretchable display device is a next-generation display in which a display screen is stretched flexibly and is a field that still requires a lot of research. According to the results of future research, the stretchable display device is expected to be applied to various products such as a wearable device attached to the body or clothes, a head-up display inserted into the windshield of a vehicle, which slightly expands or contracts depending on external temperature, or the like, and other display devices that require adjustment of the display screen.

One of the technical difficulties of the stretchable display device is that the pixel resolution and luminance of the stretchable display device is changed before and after the stretchable display device is stretched. In other words, when the stretchable display device is stretched, as spacing between pixels increases compared to the same number of pixels, the number of pixels per unit area decreases, resulting in a decrease in resolution and luminance. As such, when a change in resolution/luminance occurs depending to a stretching degree, an image may be distorted.

Separate pixel driving is needed to keep resolution and luminance of the stretchable display device constant irrespective of a stretching degree. To this end, as the driving system recognizes the display state before and after being stretched, there is a need to implement a sensor which and feedback-drives the pixel in response to it. For example, because a separate block, such as a strain sensor, for measuring a stretching state of the stretchable display device is required and because stretch should be measured for each pixel area when a stretching degree differs for each pixel area, an element such as a strain sensor should be added per area which should be measured.

SUMMARY

Embodiments of the inventive concept provide a stretchable display device capable of correcting display resolution and luminance depending to a stretching degree.

Embodiments of the inventive concept provide a stretchable display device capable of adjusting display resolution and luminance without the necessity of a separate strain sensor or a switch which operates by a control signal.

Embodiments of the inventive concept provide a stretchable display device capable of implementing a display depending on a stretching state of a substrate having a wavy structure based on a sensing line disposed on the substrate and proceeding with detecting stretch for each pixel to much more precisely detect stretch and supplement resolution and luminance.

According to an exemplary embodiment, a stretchable display device may include a stretchable substrate, first light emitting pixels including first light emitting elements arranged spaced apart from each other on the stretchable substrate, deformation switch parts arranged between the first light emitting pixels on the stretchable substrate and stretched and deformed according to stretch of the stretchable substrate, and second light emitting pixels including second light emitting elements arranged between the first light emitting pixels on the stretchable substrate. The second light emitting pixels may be controlled to emit light depending on physical deformation of the deformation switch parts.

Each of the deformation switch parts may have an electrical contact point having conductivity. Each of the second light emitting pixels may have a pixel contact points having conductivity. Each of the deformation switch parts may be deformed such that the electrical contact point moves between a first position being a position where the electrical contact point is spaced apart from the pixel contact point and a second position being a position where the electrical contact point is in contact with the pixel contact point depending on stretch of the stretchable substrate. Each of the second light emitting pixels may be controlled to emit light depending on whether there is a contact between the electrical contact point and the pixel contact point or may be controlled to emit light depending on a change in resistance and/or capacitance according to deformation of each of the deformation switch parts.

Each of the deformation switch parts may be electrically connected with at least one of a light emitting element, an active element, a passive element, and a power wire part of each of the second light emitting pixels.

Each of the deformation switch parts may be disposed in a convex shape on the stretchable substrate or may be disposed in a concave portion on the stretchable substrate.

Opposite ends of each of the deformation switch parts may be fixed on the stretchable substrate, and a middle area between the opposite ends of each of the deformation switch parts may be spaced apart from an upper surface of the stretchable substrate in a state where the stretchable substrate is not stretched.

The deformation switch parts may include a first deformation switch part having a first stretching rate and a second deformation switch part having a second stretching rate different from the first stretching rate.

Stretch may be detected and pixel light emission may be controlled, as a contact state with the pixel contact point is changed according to deformation of each of the deformation switch parts according to a stretching force or as resistance and/or capacitance is changed.

In the case where the pixel light emission is controlled according to the change in the contact state with the pixel contact point, a first electrical contact point of the first deformation switch part may switch from a non-contact state to a contact state with a first pixel contact point, when a first stretching force (e.g., a stretching force in the direction of an X-axis, a Y-axis, or multiple axes) is applied to the stretchable substrate in one direction or a plurality of directions.

A second electrical contact point of the second deformation switch part may be maintained in a non-contact state with a second pixel contact point, when the first stretching force is applied to the stretchable substrate.

The second electrical contact point of the second deformation switch part may switch to a contact state with the second pixel contact point, when a second stretching force greater than the first stretching force is applied to the stretchable substrate.

An embodiment of the inventive concept is not limited to that the pixel light emission is controlled as the contact state with the pixel contact point is changed according to the deformation of each of the deformation switch parts according to the stretching force. Stretch may be detected and pixel light emission may be controlled, as resistance and/or capacitance is changed.

The stretchable display device may further include a power wire part formed on the stretchable substrate and configured to apply power. The pixel contact point may be an area corresponding to a lower position of the electrical contact point of each of the deformation switch parts in the power wire part.

Each of the second light emitting pixels may further include a first transistor driven according to scan power applied through a scan line and a second transistor that supplies power applied through the power wire part to a second light emitting element depending on data power applied through a data line, when the first transistor is driven. Each of the deformation switch parts may be electrically connected with a first node corresponding to a drain terminal or a source terminal of the second transistor.

A first node corresponding to any one of a drain terminal or a source terminal of the second transistor may be electrically connected with the power wire part. Each of the deformation switch parts may be electrically connected with the second light emitting element.

The second light emitting element may be disposed on each of the deformation switch parts. A pixel circuit part including the first transistor and the second transistor may be formed on an upper surface of the stretchable substrate.

The first node corresponding to the any one of the drain terminal or the source terminal of the second transistor may be electrically connected with the power wire part.

The pixel contact point may be a second node corresponding to the other of the drain terminal or the source terminal of the second transistor.

The second light emitting pixel may be electrically short-circuited with the pixel circuit part in a state where the stretchable substrate is not stretched and may be electrically connected with the pixel circuit part through each of the deformation switch parts, in a state where the stretchable substrate is stretched and where the electrical contact point is in contact with the pixel contact point.

The deformation switch parts may include a first deformation switch part and a second deformation switch part, each of which has a different stretching rate. The first deformation switch part and the second deformation switch part may have different sizes, may have different shapes, or may be formed of different materials.

The number of pixels which emit light among the second light emitting pixels may be changed according to a stretching force applied to the stretchable substrate.

The deformation switch parts may be arranged along a direction where the stretchable substrate is stretchable or are arranged in the form of a grid.

The stretchable substrate may be implemented in a pre-stretch scheme to be provided on a substrate part having a wavy structure, and the deformation switch parts may be formed in concave portions of the stretchable substrate The stretchable display device may further include a sensing line part located an upper side of the substrate part and a stretching state detection part that detects a stretching state of the substrate part depending on a change in distance between the sensing line part and the deformation switch parts according to stretch of the substrate part. Light emission of each of the second light emitting pixels may be controlled according to the stretching state of the substrate part.

According to an exemplary embodiment, a stretchable display device may include a stretchable substrate, first light emitting pixels including first light emitting elements arranged spaced apart from each other on the stretchable substrate, deformation switch parts arranged between the first light emitting pixels on the stretchable substrate and having electrical contact points, each of which has conductivity, and second light emitting pixels including second light emitting elements arranged between the first light emitting pixels on the stretchable substrate and having pixel contact points, each of which has conductivity.

The deformation switch parts may be provided to be deformable such that each of the electrical contact points moves from a first position to a second position. The first position may be a position where each of the electrical contact points is spaced apart from the corresponding pixel contact point, and the second position may be a position where each of the electrical contact points is in contact with the corresponding pixel contact point. An upper surface of each of the pixel contact points may be the same in height as an upper surface of the stretchable substrate or may be higher in height than the upper surface of the stretchable substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Advantages, features, and methods of accomplishing the same will become apparent with reference to embodiments described in detail below together with the accompanying drawings. However, the inventive concept is not limited to the embodiments described below, but may be implemented in various forms. The embodiments are provided so that the disclosure of the inventive concept will be complete and thorough and to fully convey the scope of the inventive concept to those skilled in the art to which the inventive concept pertains and the inventive concept is only defined by the scope of claims.

Unless otherwise defined herein, all terms (including technical and scientific terms) used in the specification may have the same meaning that is generally understood by a person skilled in the art. Also, terms which are defined in a dictionary and commonly used should be interpreted as not in an idealized or overly formal detect unless expressly so defined. The terms such as "a first", "a second" in the specification are used to distinguish one element from another element, and the claims of the inventive concept are not limited to these terms. For example, a first element may be termed a second element. Similarly, a second element may be termed a first element.

Furthermore, the term such as "~unit" described in the specification refers to software or a hardware element such as a field-programmable gate array (FPGA) or an ASIC. The "~unit" performs certain roles. However, the "~unit" does not refer to being not limited to software or hardware. The "~unit" may be configured to be included in an addressable storage medium or to reproduce one or more processors. Therefore, as an example, "~nit" may include various elements such as software elements, object-oriented software elements, class elements, and task elements, processes, functions, attributes, procedures, subroutines, program code segments, drivers, firmware, microcodes, circuits, data structures, and variables. Functions provided in "units" and elements may be combined with a smaller number of elements and 'units' or may be further be divided into additional elements and "units".

Figure 1:
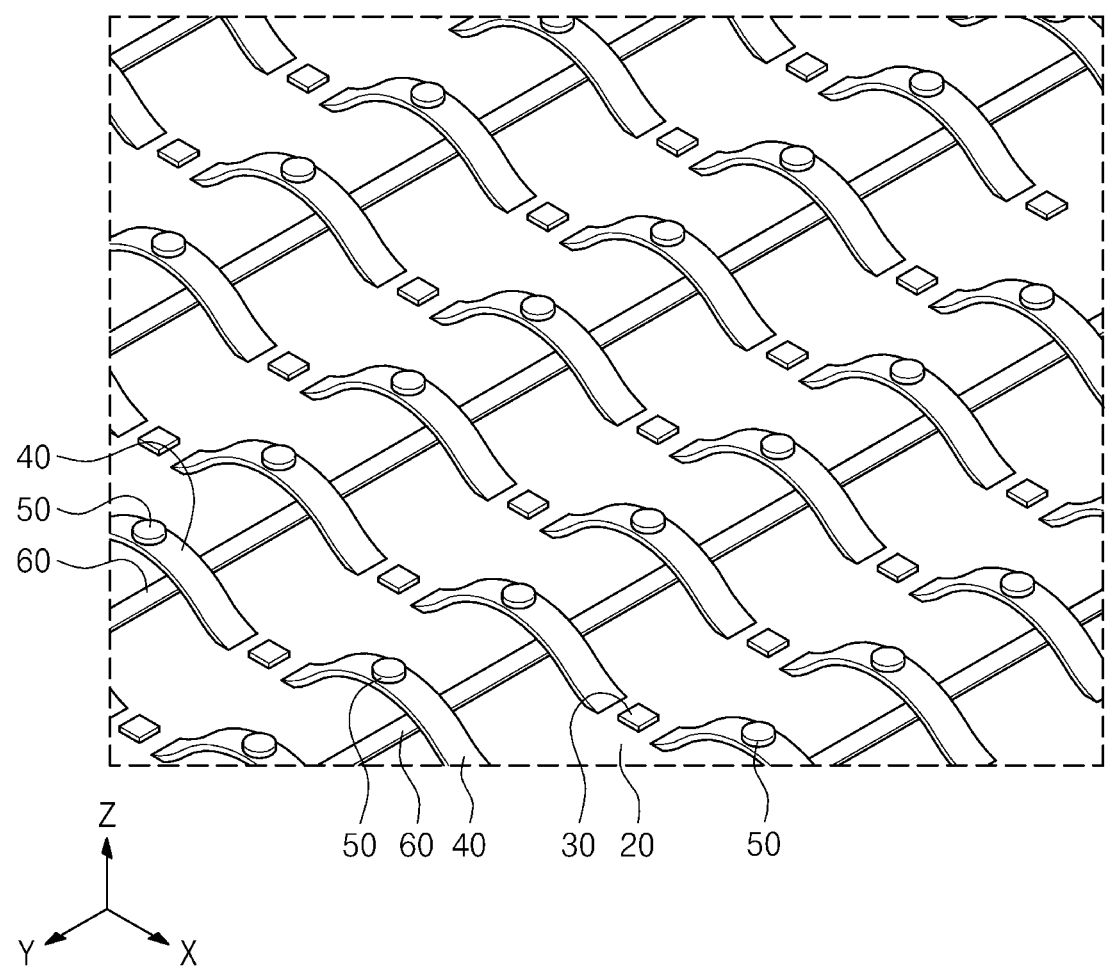
FIG. 1 is a perspective view illustrating a stretchable display device according to an embodiment of the inventive concept.
Figure 2:
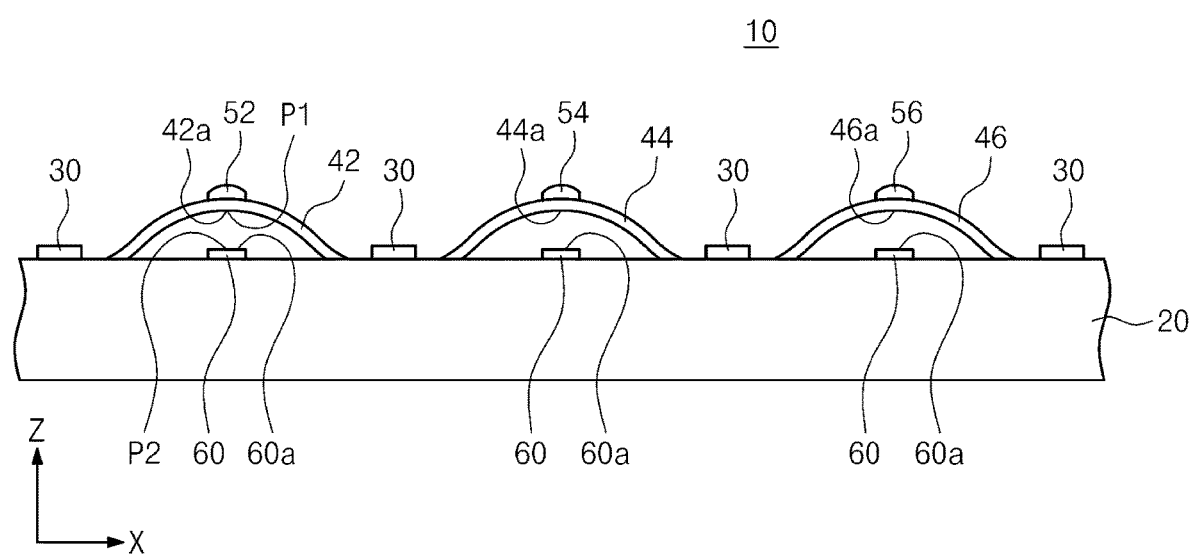
FIG. 2 is a side view illustrating a stretchable display device according to an embodiment of the inventive concept.

FIG. 1 is a perspective view illustrating a stretchable display device according to an embodiment of the inventive concept. FIG. 2 is a side view illustrating a stretchable display device according to an embodiment of the inventive concept.

Referring to FIGS. 1 and 2, a stretchable display device 10 according to an embodiment of the inventive concept may include a stretchable substrate 20, first light emitting pixels 30, deformation switch parts 40, second light emitting pixels 50, and a power wire part 60.

In the stretchable display device 10 according to an embodiment of the inventive concept, as the number of pixels which emit light among the second light emitting pixels 50 is changed according to a stretching degree (or a stretching force) of the stretchable substrate 20, pixel resolution may be kept constant irrespective of the stretching degree of the stretchable substrate 20.

The stretchable display device 10 according to an embodiment of the inventive concept may be used as various application products, for example, a display device of a wearable electronic device, which is used by being attached to or worn on the body, a head-up display applied to the glass of the vehicle, or a display device capable of adjusting a display screen size.

The stretchable substrate 20 may be a substrate having stretchable properties, which includes a stretchable material to be stretchable. The stretchable substrate 20 may be a substrate which is stretchable in one direction parallel to a substrate surface or in several directions.

An example of the stretchable material forming the stretchable substrate 20 may be, but is not limited to, polydimethylsiloxane (PDMS), styrene ethylene/butylene styrene (SEBS), rubber, polyethylene terephthalate (PET), polystyrene (PS), polyimide (PI), polyvinyl chloride (PVC), polyethylene (PE), or the like.

The stretchable substrate 20 is not necessarily limited to including the stretchable material. The stretchable substrate 20 may be composed of, for example, a structure formed of a fibrous structure, a lattice structure, or the like and may be implemented to be stretchable. Furthermore, the stretchable substrate 20 may be implemented in a structurally stretchable structure, such as an auxetic structure, although there is no stretch due to material characteristics.

The stretchable substrate 20 may be a substrate which is stretched when a stretching force is applied to the substrate and is restored to its original state when the stretching force disappears. FIG. 1 illustrates the stretchable substrate 20 which is stretched in a first direction X parallel to the substrate surface.

The stretchable substrate 20 may be stretched in the first direction X. Furthermore, the stretchable substrate 20 may be provided as a flexible substrate which has flexibility capable of being bent in at least one direction at the same time as having stretch.

In an example of FIG. 1, a second direction Y may be a direction perpendicular to the first direction X on the substrate surface, and a third direction Z may be a direction perpendicular to both the first direction X and the second direction Y, that is, a direction perpendicular to the substrate surface.

The first light emitting pixels 30 may be arranged spaced apart from each other on the stretchable substrate 20. The first light emitting pixel 30 may include a first light emitting element and a pixel circuit part which drives the first light emitting element.

The first light emitting element of the first light emitting pixel 30 may be provided as, for example, a light emitting diode (LED), or an organic light emitting diode (OLED), or the like, but not limited thereto.

In the example illustrated, the first light emitting pixels 30 may form rows and columns in the first direction X and the second direction Y to be arranged in a matrix structure, but the arrangement structure of the first light emitting pixels 30 is not limited to that illustrated.

The first light emitting pixels 30 may be pixels which may be mounted on the stretchable substrate 20 and may emit light in a state where the stretchable substrate 20 is not stretched, as well as a state where the stretchable substrate 20 is stretched.

The first light emitting pixels 30 may sequentially and repeatedly emit light in units of rows or columns according to power applied through scan lines. Furthermore, the first light emitting pixels 30 may emit light depending on a high/low level power applied through data lines.

In the stretchable display device 10, display resolution (or the number of pixels per unit area) in the state where the stretchable substrate 20 is not stretched may be determined according to the arrangement of the first light emitting pixels 30.

The stretchable display device 10 according to an embodiment of the inventive concept may have the deformation switch parts 40 and the second light emitting pixels 50 to prevent the number of pixels per unit area (or resolution) from decreasing as an area of the stretchable substrate 20 increases when the stretchable substrate 20 is stretched.

The deformation switch part 40 may be disposed in an area between the first light emitting pixels 30 which are adjacent to each other on the stretchable substrate 20. The deformation switch part 40 may be stretched and deformed as the stretchable substrate 20 is stretched.

In an embodiment, the deformation switch part 40 may be provided in a dome-shaped structure which is convex upward. Opposite ends of the deformation switch part 40 may be fixed on the stretchable substrate 20. Thus, the deformation switch part 40 may be stretched together when the stretchable substrate 20 is stretched.

A middle area between the opposite ends of the deformation switch part 40 may be disposed spaced apart from an upper surface of the stretchable substrate 20 in a state where the stretchable substrate 20 is not stretched.

The deformation switch part 40 may be electrically connected with at least one of a light emitting element making up the second light emitting pixel 50, an active element (e.g., a thin film transistor), a passive element (e.g., a capacitor), and the power wire part 60.

The deformation switch part 40 may be formed of a conductive material partially or entirely. The deformation switch part 40 may have electrical contact points 42a, 44a, and 46a, each of which has conductivity. Each of the electrical contact points 42a, 44a, and 46a may be a central portion of a lower surface of the deformation switch part 40.

The conductive material of the deformation switch part 40 may be provided as a stretchable conductive material, for example, liquid metal, an amorphous alloy, double structure polymer metal, or the like, but various stretchable conductive materials other than the listed materials may be used in the deformation switch part 40.

The deformation switch part 40 may be formed of, for example, an organic-based material, such as a conductive polymer, a metal-based material, such as Al, Au, or Ti, an inorganic-based material, such as ITO, IZO, or GZO, a liquid metal-based material, or the like.

Various schemes for connecting the deformation switch part 40 on the stretchable substrate 20 may be used. As an example, a scheme which separately manufactures the deformation switch part 40 and bonds the deformation switch part 40 on the stretchable substrate 20 may be used.

As another example, a scheme which places a mold for forming the deformation switch part 40 on the stretchable substrate 20 forms the deformation switch part 40 on the mold, and bonds opposite ends of the deformation switch part 40 on the stretchable substrate 20 may be used.

The second light emitting pixels 50 may be arranged between the first light emitting pixels 30 on the stretchable substrate 20. The second light emitting pixels 50 may be pixels capable of emitting light only when the stretchable substrate 20 is stretched to keep resolution of the stretchable display device 10 constant.

The second light emitting pixels 50 may have pixel contact points 60a, each of which has conductivity, to control operations of the second light emitting pixels 50 without measuring a stretching force applied to the stretchable substrate 20.

In other words, the second light emitting pixels 50 may be pixels which do not emit light in a state where the stretchable substrate 20 is not stretched. The second light emitting pixels 50 may be arranged to form arrangement such that resolution of the stretchable display device 10 is kept constant when the stretchable substrate 20 is stretched.

The power wire part 60 may be formed on the stretchable substrate 20. In an embodiment of FIG. 1, the power wire part 60 may extend in the second direction Y to be formed to apply power to the second light emitting pixels 50 in units of rows or columns.

The second light emitting pixels 50 may be controlled to emit light depending on whether there is a contact between the electrical contact points 42a, 44a, and 46a and the pixel contact points 60a according to physical deformation of the deformation switch parts 40 when the stretchable substrate 20 is stretched.

In case of an embodiment of FIG. 1, the pixel contact points 60a of the second light emitting pixels 50 may be areas corresponding to lower positions of the electrical contact points 42a, 44a, and 46a of the deformation switch parts 40 among the power wire parts 60.

For contact points with the deformation switch parts 40, heights of upper surfaces of the pixel contact points 60a of the second light emitting pixels 50 may be designed to be the same as the upper surface of the stretchable substrate 20 or be higher than the upper surface of the stretchable substrate 20.

Like the first light emitting pixels 30, the second light emitting pixels 50 may be arranged spaced apart from each other on the stretchable substrate 20. The second light emitting pixel 50 may include a second light emitting element and a pixel circuit part which drives the second light emitting element.

The second light emitting element of the second light emitting pixel 50 may be provided as, for example, a light emitting diode LED, or an organic light emitting diode (OLED), or the like, but not limited thereto.

In the example illustrated, the second light emitting pixels 50 may form rows and columns in the first direction X and the second direction Y to be arranged in a matrix structure, but the arrangement structure of the second light emitting pixels 50 is not limited to that illustrated.

The second light emitting pixels 50 may be pixels which may be mounted on the stretchable substrate 20, may not emit light in a state where the stretchable substrate 20 is not stretched and when a stretching force of less than a threshold stretching force is applied to the stretchable substrate 20, and may emit light in a state where the stretchable substrate 20 is stretched above the threshold stretching force.

As such, the second light emitting pixels 50 may act as resolution compensation pixels which emit light when the stretchable substrate 20 is stretched and keep resolution of the stretchable display device 10 uniform.

The second light emitting pixels 50 may sequentially or repeatedly emit light in units of rows or columns depending on power supplied through scan lines, when the stretchable substrate 20 is stretched above the threshold stretching force, and may emit light depending on a high/low level power applied through data lines.

The deformation switch parts 42, 44, and 46 may be deformed to move in an upward and downward direction parallel to the third direction Z between a first position P1, which is a position where the electrical contact points 42a, 44a, and 46a are spaced apart from the pixel contact points 60a, and a second position P2, which is a position where the electrical contact points 42a, 44a, and 46a are in contact with the pixel contact points 60a, as the stretchable substrate 20 is stretched.

Each of the deformation switch parts 42, 44, and 46 may be located at the first position P1 where each of the electrical contact points 42a, 44a, and 46a is spaced apart from the corresponding pixel contact point 60a in a state where stretch is not applied to the stretchable substrate 20.

In this case, as the electrical contact points 42a, 44a, and 46a of the deformation switch parts 42, 44, and 46 are electrically short-circuited with the pixel contact points 60a of the second light emitting pixels 52, 54, and 56, working power may not be applied to second light emitting elements of the second light emitting pixels 52, 54, and 56 and the second light emitting pixels 52, 54, and 56 may operate as inactive pixels.

On the other hand, in a state where stretch above the threshold stretching force is applied to the stretchable substrate 20, the deformation switch parts 42, 44, and 46 may be deformed to be located at the second position P2 where each of the electrical contact points 42a, 44a, and 46a is in contact with the corresponding pixel contact point 60a.

In this case, as the electrical contact points 42a, 44a, and 46a of the deformation switch parts 42, 44, and 46 are electrically connected with the pixel contact points 60a of the second light emitting pixels 52, 54, and 56, working power may be applied to the second light emitting elements of the second light emitting pixels 52, 54, and 56 and the second light emitting pixels 52, 54, and 56 may operate as active pixels.

Figure 3:
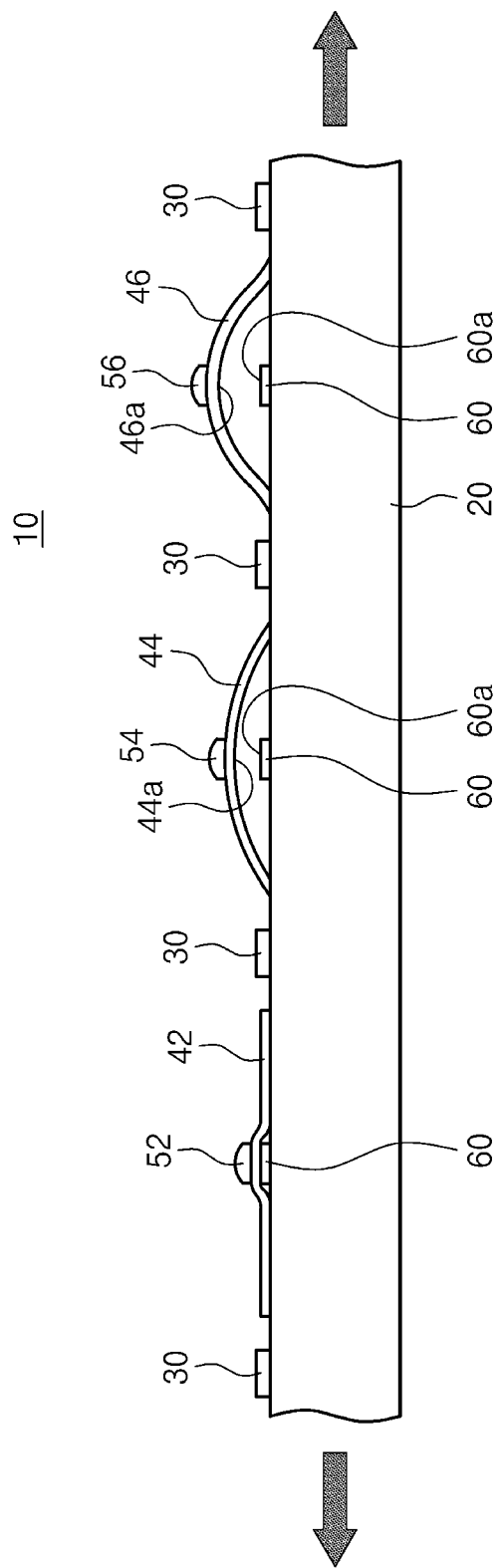
FIGS. 3, 4, and 5 are drawings illustrating an operation state of a stretchable display device according to an embodiment of the inventive concept.
Figure 4:
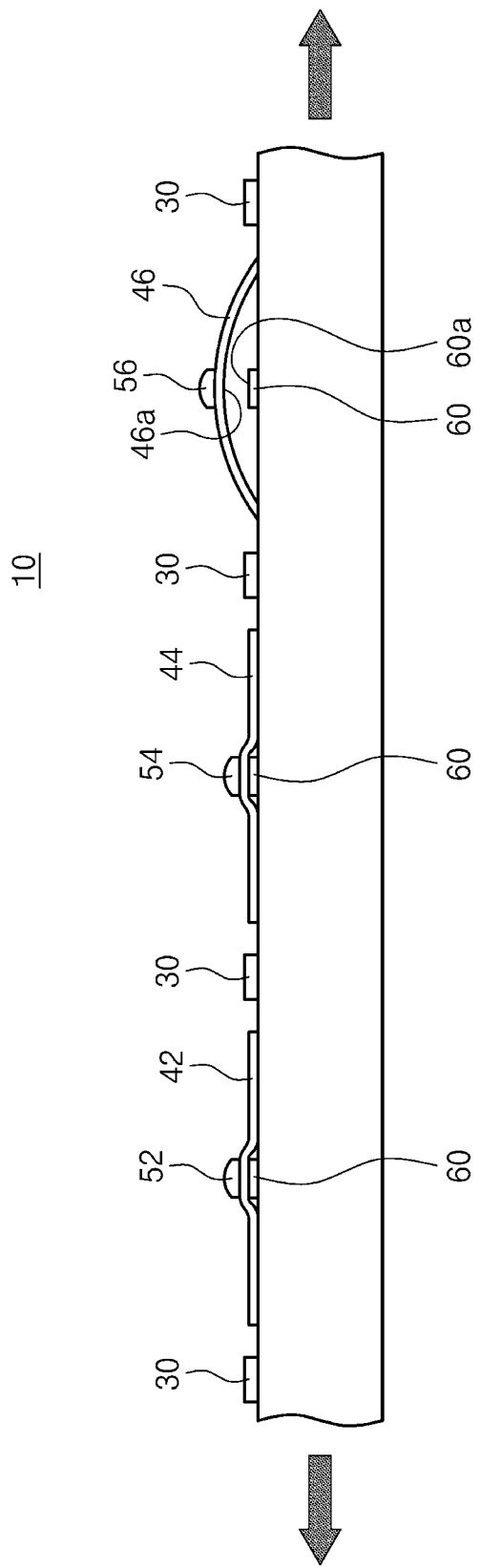
Figure 5:
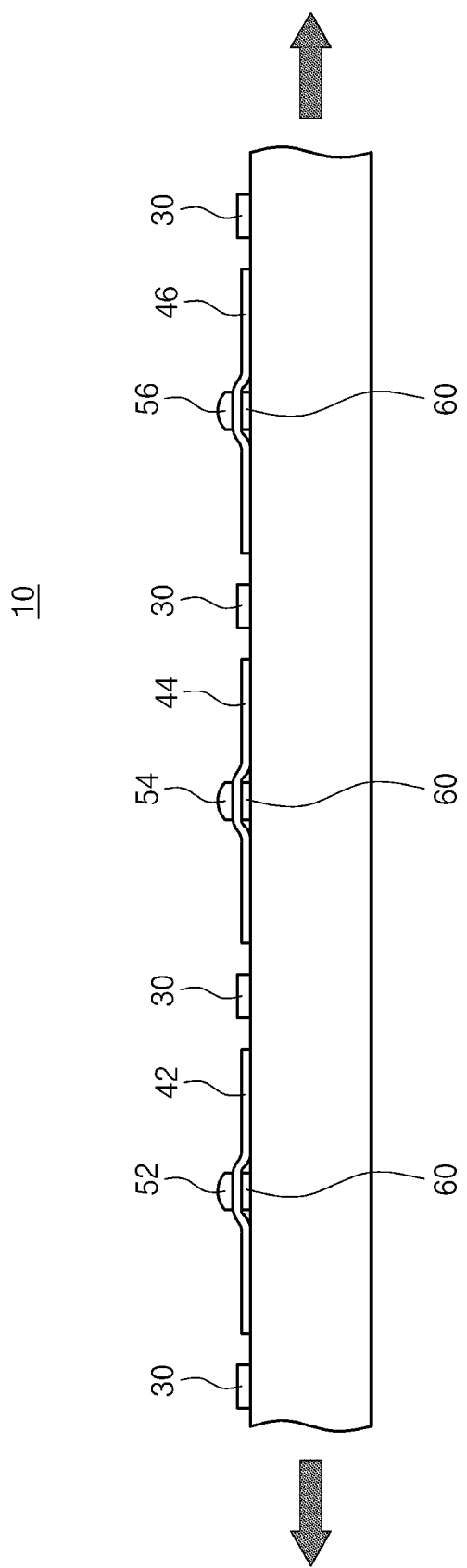

FIGS. 3 to 5 are drawings illustrating an operation state of a stretchable display device according to an embodiment of the inventive concept. In embodiments of FIGS. 3 to 5, deformation switch parts 42, 44, and 46 are designed to have different stretching rates.

A stretching rate of the first deformation switch part 42 among the first deformation switch part 42, the second deformation switch part 44, and the third deformation switch part 46 may be largest, and a stretching rate of the third deformation switch part 46 may be smallest. The second deformation switch part 44 may have a stretching rate which is less than the first deformation switch part 42 and is greater than the third deformation switch part 46.

When a stretching force corresponding to a first threshold stretching rate (e.g., a stretching rate of 20%) is applied to the stretchable substrate 20, the first electrical contact point 42a of the first deformation switch part 42 may be in contact with the first pixel contact point 60a associated with the second light emitting pixel 52 (or may switch from a non-contact state to a contact state).

When a stretching force corresponding to a second threshold stretching rate (e.g., a stretching rate of 50%) greater than first threshold stretching rate is applied to the stretchable substrate 20, the second electrical contact point 44a of the second deformation switch part 44 may be in contact with the second pixel contact point 60a associated with the second light emitting pixel 54 (or may switch from a non-contact state to a contact state).

When a stretching force corresponding to less than the second threshold stretching rate is applied to the stretchable substrate 20, the second deformation switch part 44 may be maintained in a state where the second electrical contact point 44a is not in contact with the pixel contact point 60a associated with the second light emitting pixel 54.

When a stretching force corresponding to a third threshold stretching rate (e.g., a stretching rate of 75%) greater than the second threshold stretching rate is applied to the stretchable substrate 20, the third electrical contact point 46a of the third deformation switch part 46 may be in contact with the third pixel contact point 60a associated with the second light emitting pixel 56 (or may switch from a non-contact state to a contact state).

When the stretching force corresponding to the third threshold stretching rate is applied to the stretchable substrate 20, the third deformation switch part 46 may be maintained in a state where the second electrical contact point 46a is not in contact with the pixel contact point 60a associated with the second light emitting pixel 56.

In case of embodiments of FIGS. 2 to 5, when a low stretching rate of less than the first threshold stretching rate is applied to the stretchable substrate 20, as shown in FIG. 2, because all the three deformation switch parts 42, 44, and 46 are not in contact with the pixel contact points 60a, all the three second light emitting pixels 52, 54, and 56 operate as inactive pixels.

When a stretching rate of greater than or equal to the first threshold stretching rate and less than the second threshold stretching rate is applied to the stretchable substrate 20, as shown in FIG. 3, as only the one deformation switch part 42 among the three deformation switch part 42, 44, and 46 is in contact with the pixel contact point 60a, only the one second light emitting pixel 52 among the three second light emitting pixels 52, 54, and 56 operates as an active pixel.

Furthermore, when a stretching rate of greater than or equal to the second threshold stretching rate and less than the third threshold stretching rate is applied to the stretchable substrate 20, as shown in FIG. 4, as the two deformation switch parts 42 and 44 among the three deformation switch part 42, 42, 44, and 46 are respectively in contact with the corresponding pixel contact points 60a, only the two second light emitting pixels 52 and 54 among the three second light emitting pixels 52, 52, 54, and 56 operate as active pixels.

Furthermore, when a stretching rate of greater than or equal to the third threshold stretching rate is applied to the stretchable substrate 20, as shown in FIG. 5, as all the three deformation switch parts 42, 44, and 46 are respectively in contact with the corresponding pixel contact points 60a, all the three second light emitting pixels 52, 54, and 56 operate as active pixels.

As such, the number of the second light emitting pixels 50 which operate as active pixels increases in proportion to the stretching rate applied to the stretchable substrate 20. Thus, as the number of the second light emitting pixels 50 is adjusted according to a stretching degree applied to the stretchable substrate 20, constant resolution may always be maintained.

Various schemes for changing stretching rates of the deformation switch parts 40 may be used. For example, the deformation switch parts 40 may be formed of different materials or the deformation switch parts 40 may be designed to have different sizes, shapes, and the like to differently adjust a stretching rate.

Figure 6:
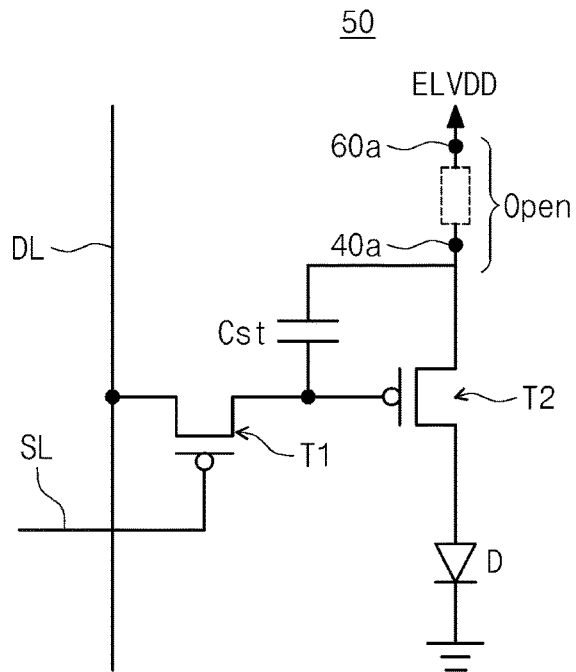
FIGS. 6 and 7 are circuit diagrams illustrating an operation of a second light emitting pixel making up a stretchable display device according to an embodiment of the inventive concept.
Figure 7:
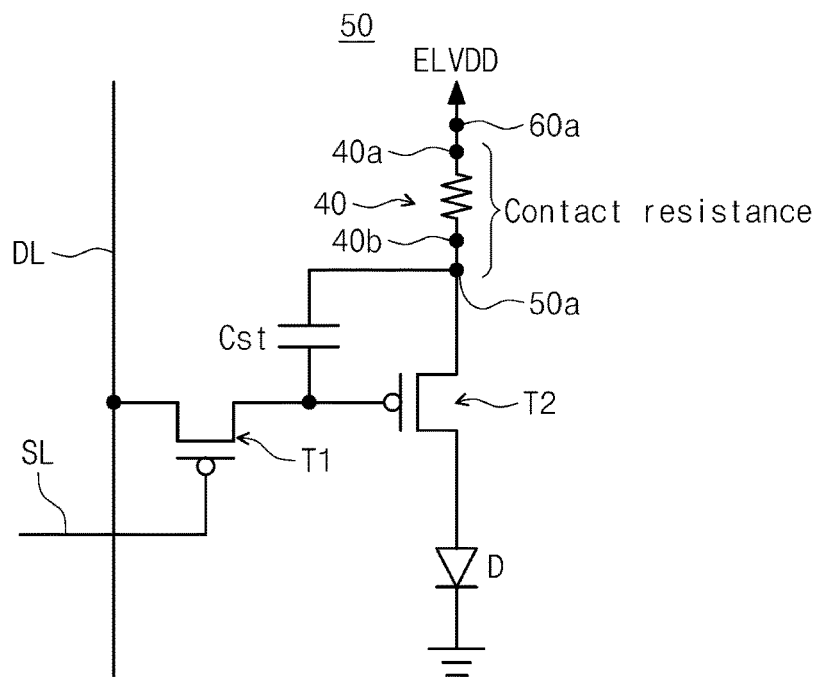

FIGS. 6 and 7 are circuit diagrams illustrating an operation of a second light emitting pixel making up a stretchable display device according to an embodiment of the inventive concept. FIG. 6 illustrates a state where a second light emitting pixel operates as a deactivated pixel. FIG. 7 illustrates a state where a second light emitting pixel operates as an activated pixel.

Referring to FIGS. 1, 2, 6, and 7, a second light emitting pixel 50 may include a second light emitting element D and a pixel circuit part for driving the second light emitting element D. The pixel circuit part may include a first transistor T1, a second transistor T2, and a capacitor $C_{st}$.

In embodiments of FIGS. 6 and 7, the second light emitting element D and the pixel circuit part (or the transistors and the capacitor) of the second light emitting pixel 50 may be formed on a deformation switch part 40. A pixel contact point 60a associated with the second light emitting pixel 50 may be formed on a power wire part 60 on an upper surface of the stretchable substrate 20.

The first transistor T1 may be driven according to scan power applied to a gate terminal through a scan line SL. The first transistor T1 may be implemented as a P-channel metal oxide semiconductor (PMOS) transistor or an N-channel metal oxide semiconductor (NMOS) transistor.

One end of a drain terminal and a source terminal of the first transistor T1 may be connected with a data line DL, and the other may be connected with a gate terminal of the second transistor T2. Furthermore, one end of the capacitor $C_{st}$ may be connected with the other end of the first transistor T1.

The second transistor T2 may supply power ELVDD applied through the power wire part 60 to the second light emitting element D depending on data power supplied through the data line DL when the first transistor T1 is driven. The gate terminal of the second transistor T2 may be connected with the other end (or the drain terminal or the source terminal) of the first transistor T1.

One end 50a (or a first node) between a drain terminal and a source terminal of the second transistor T2 may be connected with the other end of the capacitor $C_{st}$. The other end (or a second node) between the drain terminal and the source terminal of the second transistor T2 may be connected with one end of a second light emitting element D. The second transistor T2 may be implemented as a PMOS transistor or an NMOS transistor.

According to a stretching degree of a stretchable substrate 20, an electrical contact point 40a of a deformation switch part 40 may be spaced apart from a pixel contact point 60a of a second light emitting pixel 50 provided in the power wire part 60 as shown in FIG. 6 or to be in contact with the pixel contact point 60a as shown in FIG. 7.

The deformation switch part 40 may be electrically connected with the one end 50a of the second transistor T2 making up a pixel circuit part of the second light emitting pixel 50 and the other end of the capacitor $C_{st}$ through a connection node 40b.

The capacitor $C_{st}$ may provide an active driving function of maintaining a voltage of the gate terminal of the second transistor T2 during a scan period. The one end of the capacitor $C_{st}$ may be connected with the other end of the first transistor T1 and the gate terminal of the second transistor T2.

The other end of the capacitor $C_{st}$ may be electrically connected with the one end 50a of the second transistor T2 and the connection node 40b of the deformation switch part 40. The second light emitting element D may be connected between the other end of the second transistor T2 and the ground.

As shown in FIG. 6, when the electrical contact point 40a of the deformation switch part 40 is spaced apart from the pixel contact point 60a of the second light emitting pixel 50 provided in the power wire part 60, a power ELVDD of the power wire part 60 may not be transferred to the pixel circuit part of the second light emitting pixel 50. Thus, the second light emitting pixel 50 may fail to emit light.

On the other hand, as shown in FIG. 7, when the electrical contact point 40a of the deformation switch part 40 is in contact with the pixel contact point 60a of the second light emitting pixel 50 provided in the power wire part 60, the power ELVDD of the power wire part 60 may be transferred to the pixel circuit part of the second light emitting pixel 50.

At this time, as contact resistance between the pixel circuit part and the power wire part 60 has a low value due to conductivity of the deformation switch part 40, the power ELVDD may be efficiently supplied to the pixel circuit part. Thus, the second light emitting pixel 50 may smoothly emit light by means of the pixel circuit part.

As described above, a stretchable display device 10 according to an embodiment of the inventive concept may be stretched together with the stretchable substrate 20 to apply power to the second light emitting pixel 50 when the stretchable substrate 20 is stretched by the deformation switch part 40 which is physically deformed.

Thus, the stretchable display device 10 according to an embodiment of the inventive concept may maintain constant display resolution irrespective of a stretching degree of the stretchable substrate 20 without the necessity of a separate strain sensor or a switch which operates by a control signal.

Figure 8:
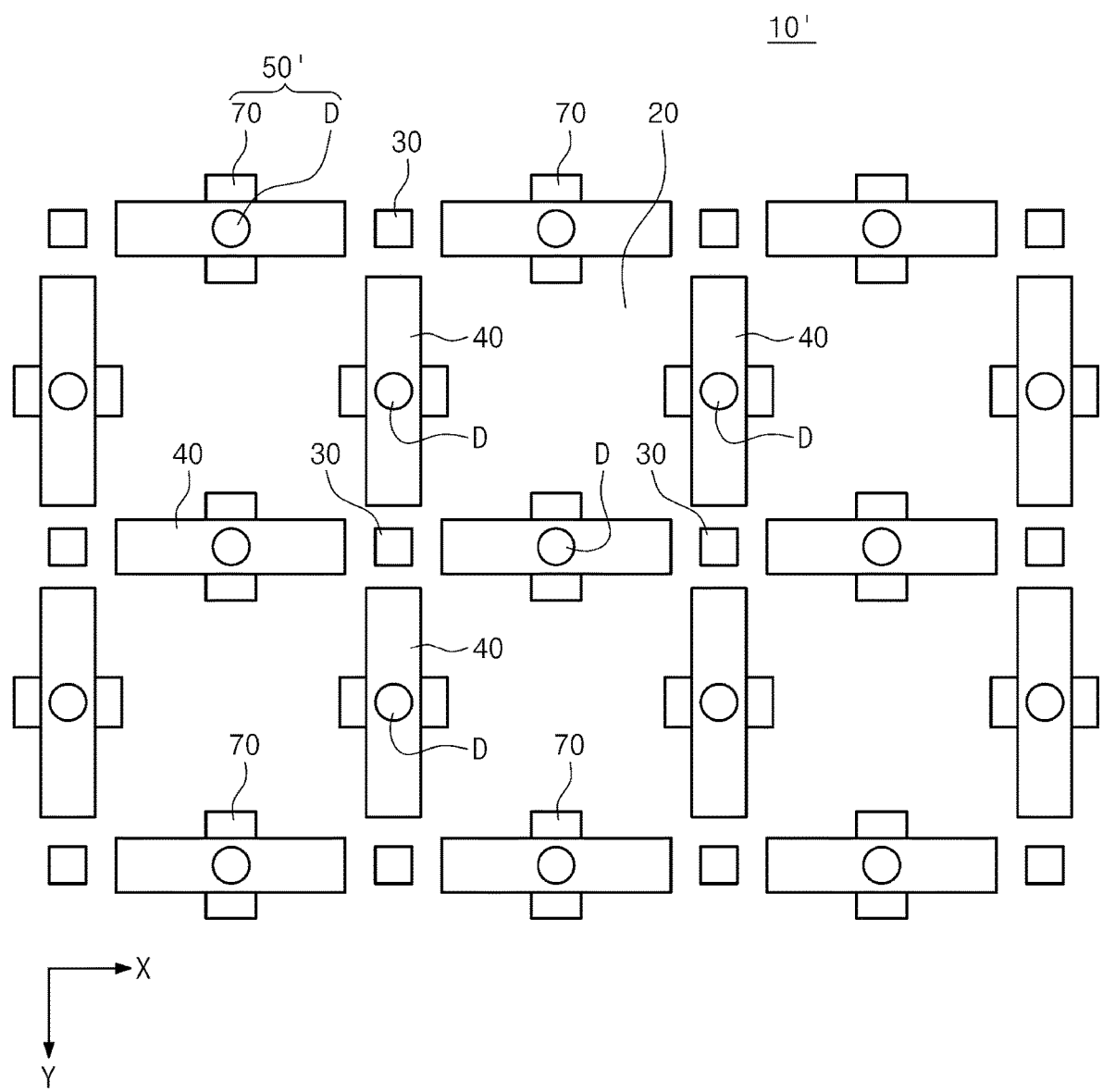
FIG. 8 is a plan view illustrating a stretchable display device according to another embodiment of the inventive concept.

FIG. 8 is a plan view illustrating a stretchable display device according to another embodiment of the inventive concept. Although a stretchable substrate 20 is stretched in any direction of a substrate surface as deformation switch parts 40 are arranged in the form of a grid, a stretchable display device 10' according to an embodiment of FIG. 8 may be implemented to facilitate resolution compensation by second light emitting pixels 50'.

Each of the deformation switch parts 40 may be disposed between first light emitting pixels 30 adjacent to each other in a first direction X and between the first light emitting pixels 30 adjacent to each other in a second direction Y and may be formed in the first direction X and the second direction Y.

Thus, when stretch is applied to the stretchable substrate 20 in the second direction Y, display resolution of the second direction Y may be adjusted by the deformation switch parts 40 arranged in the second direction Y.

In describing an embodiment of the FIG. 8, a duplicated description of the configuration which is the same as or correspond to the embodiment described above will be omitted. The second light emitting pixel 50 making up the stretchable display device 10' according to an embodiment of FIG. 8 may include a second light emitting element D and a pixel circuit part 70 for driving the second light emitting element D.

The second light emitting element D of the second light emitting pixel 50' may be formed on the deformation switch part 40. A power wire part 60 and the pixel circuit part 70 may be formed on an upper surface of the stretchable substrate 20 rather than the deformation switch part 40.

Figure 9:
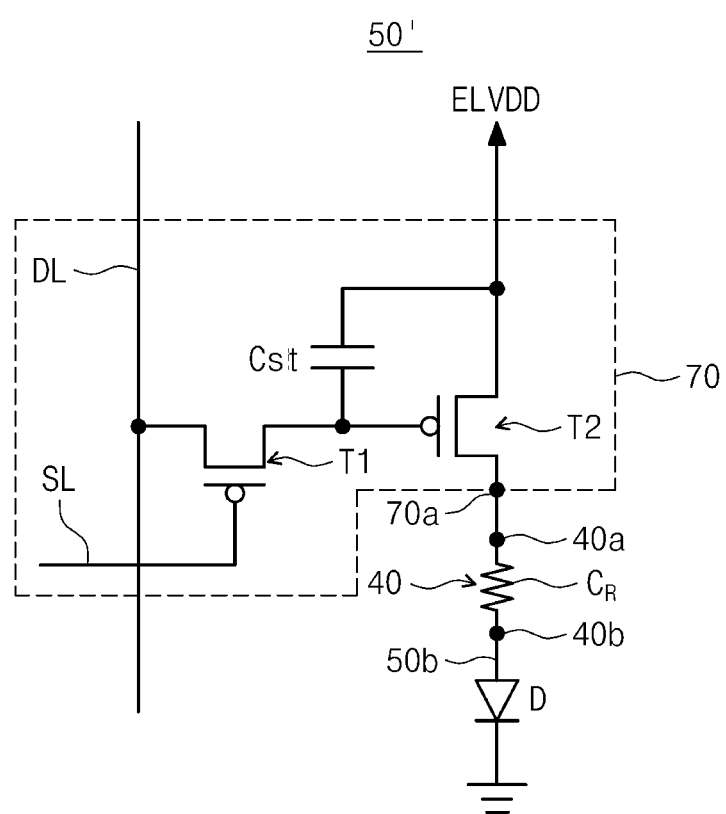
FIG. 9 is a circuit diagram of a second light emitting pixel making up a stretchable display device according to an embodiment of FIG. 8.

FIG. 9 is a circuit diagram of a second light emitting pixel making up a stretchable display device according to an embodiment of FIG. 8. Referring to FIGS. 8 and 9, a pixel circuit part 70 may include a first transistor T1, a second transistor T2, and a capacitor $C_{st}$. A duplicated description of the pixel circuit part 70 will be omitted because the pixel circuit part 70 is the same as the embodiment described above.

In an embodiment of FIG. 9, a deformation switch part 40 may be electrically connected with a second light emitting element D. In other words, the deformation switch part 40 may be connected with one end 50*b* of the second light emitting element D through a connection node 40*b*. The second light emitting element D may be connected between the connection node 40*b* of the deformation switch part 40 and the ground.

An electrical contact point 40*a* of the deformation switch part 40 may be in contact with or spaced apart from a pixel contact point 70*a* of a pixel circuit part 70 formed on a stretchable substrate 20 depending on a stretching degree of the stretchable substrate 20. In an embodiment of FIG. 9, the pixel contact point 70*a* of a second light emitting pixel 50' is a second node corresponding to the other end (or a drain terminal or a source terminal) of the second transistor T2.

A first node corresponding to any one of the drain terminal or the source terminal of the second transistor T2 may be electrically connected with each of the other end of the capacitor $C_{st}$ and a power wire part 60.

FIG. 9 illustrates a state where the stretchable substrate 20 is stretched and the electrical contact point 40*a* of the deformation switch part 40 is in contact with the pixel contact point 70*a* of the second light emitting pixel 50'. In this state, contact resistance $C_R$ of the deformation switch part 40 between the pixel circuit part 70 and the second light emitting element D indicates a low value and the second light emitting element D may operate as an active element.

In embodiments of FIGS. 8 and 9, the second light emitting element D may be electrically short-circuited in a state where stretch of less than a threshold stretching rate is applied to the stretchable substrate 20.

When stretch of greater than or equal to the threshold stretching rate is applied to the stretchable substrate 20, the electrical contact point 40*a* may be in contact with the pixel contact point 70*a* by stretch deformation of the deformation switch part 40. Thus, as the second light emitting element D is electrically connected with the pixel circuit part 70 by using the deformation switch part 40 as a contact point, the second light emitting element D may operate as an active element.

In a modified embodiment of the inventive concept, a second light emitting pixel 50 may be formed on the stretchable substrate 20, and the power wire part 60 may be formed on the deformation switch part 40. In this case, the electrical contact point 40*a* of the deformation switch part 40 may be a pixel area of the power wire part 60, and a pixel contact point of the second light emitting pixel 50 may be a drain terminal and a source terminal of the second transistor T2.

Figure 10:
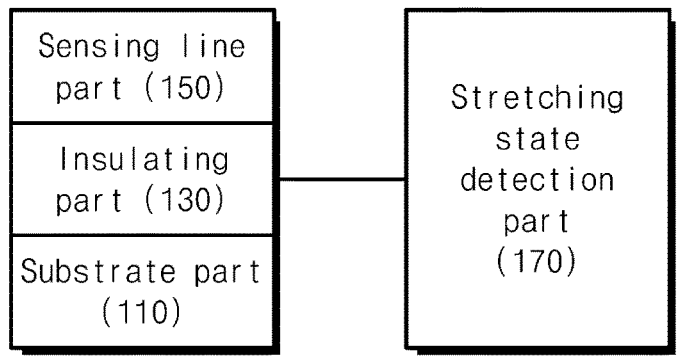
FIG. 10 is a block diagram illustrating a stretchable display device according to another embodiment of the inventive concept.
Figure 11:
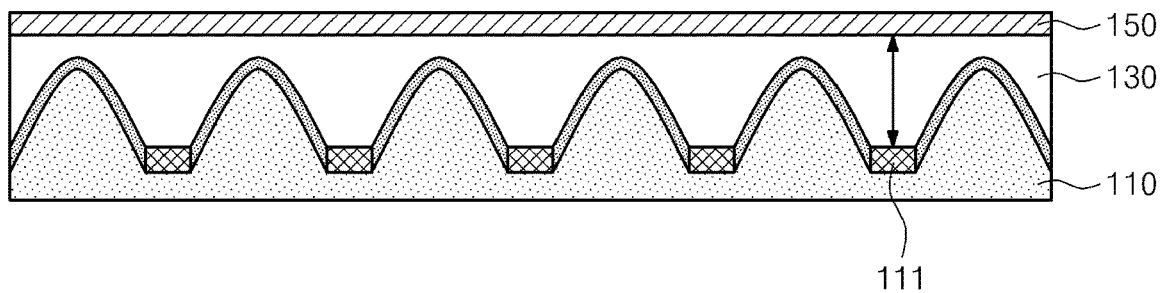
FIGS. 11 and 12 are drawings illustrating an operation of a stretchable display device according to another embodiment of the inventive concept.
Figure 12:
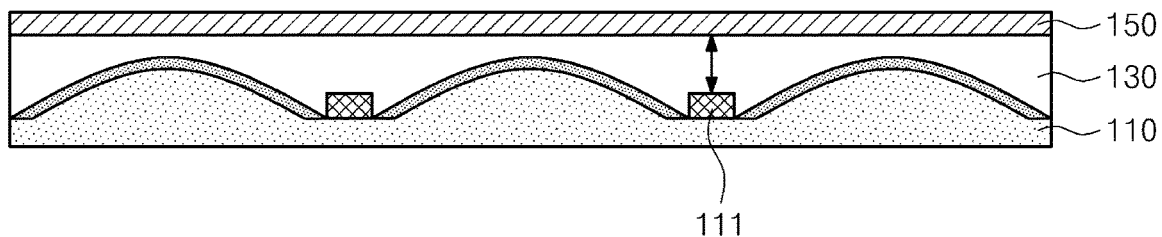

FIG. 10 is a block diagram illustrating a stretchable display device according to another embodiment of the inventive concept. FIGS. 11 and 12 are drawings illustrating an operation of a stretchable display device according to another embodiment of the inventive concept. FIG. 11 illustrates a state before a stretchable display device is stretched. FIG. 12 illustrates a state after a stretchable display device is stretched.

Referring to FIG. 10, a stretchable display device 100 according to a preferred embodiment of the inventive concept may detect a stretching state of a substrate having a wavy structure based on a change in voltage or capacitance of a sensing line disposed on the substrate, without a separate strain sensor, and may implement a display depending on the stretching state of the substrate. The stretchable display device 100 according to an embodiment of the inventive concept may be applied to stretchable display modules of various structures, for example, an active-matrix LED, an active-matrix OLED, an LCD, and an e-paper.

Meanwhile, the stretchable display device 100 according to an embodiment of the inventive concept may be implemented physically independently of a control module (not shown) of a stretchable display and may provide the detected stretching state of the substrate to a control module of the stretchable display. Then, the control module of the stretchable display may operate a pixel disposed to operate only after being stretched based on the stretching state of the substrate, which is provided from the stretchable display device 100. Of course, the stretchable display device 100 according to an embodiment of the inventive concept may be integrated and implemented into the control module of the stretchable display.

To this end, the stretchable display device 100 may include a substrate part 110, a sensing line part 150, and a stretching state detection part 170. The substrate part 110 may be provided in a structure where deformation switch parts are arranged in concave portions on the stretchable substrate. The substrate part 110 may be implemented in a pre-stretch scheme to have a wavy structure.

Such a wavy structure serves to help the stretchable display be stretched and is deformed when stretched. Herein, the substrate part 110 may include a plurality of pixel elements 111 (e.g., first light emitting pixels and second light emitting pixels, each of which has a pixel contact point disposed between the first light emitting pixels), which are formed on the substrate part 110. The plurality of pixel elements 111 may be separately turned on/off according to a signal of the control module of the stretchable display and/or stretch of the stretchable display.

In embodiments of FIGS. 11 and 12, deformation switch parts may be provided to be stretched and deformed according to stretch of the stretchable substrate on the stretchable substrate making up the substrate part 110. The deformation switch parts may be provided to have electrical contact points, each of which has conductivity. The sensing line part 150 may be located at an upper side of the substrate part 110.

The sensing line part 150 may be disposed on an upper portion of the substrate part 110 having the wavy structure to be adjusted in interval from the deformation switch parts provided on a concave area of the substrate part 110 according to a deformation pattern of the wavy structure, when the stretchable display is stretched. Thus, light emission of the second light emitting pixel provided for each area may be independently controlled based on stretching information detected for each area of the stretchable substrate.

The control module of the stretchable display device may detect stretching information for each area depending on whether there is a contact between the substrate part 110 and the sensing line part 150 or a change in voltage and/or capacitance between the substrate part 110 and the sensing line part 150 and may control light emission of the second light emitting pixel for each corresponding area. When the stretchable display device is implemented to control light emission of the second light emitting pixel depending on a change in voltage and/or capacitance between the substrate part 110 and the sensing line part 150, an insulating part 130 which is filled with insulators may be provided between the substrate part 110 and the sensing line part 150. To smooth a height of the substrate part 110 having the wavy structure, the insulating part 130 may be formed of various insulators, each of which is formed of a material having a characteristic in which electricity does not flow.

The sensing line part 150 may be formed of an organic-based material, such as a conductive polymer, a metal-based material, such as Al, Au, or Ti, an inorganic-based material, such as ITO, IZO, or GZO, a liquid metal-based material, or the like. In this case, the sensing line part 150 may be connected with a signal wire of each of a plurality of pixel elements 111 formed on the substrate part 110. Herein, the signal wire may be one of a gate signal line, a data line, or a power line.

In other words, because the signal wire of the pixel element 111 and the sensing line part 150 are opened before the substrate part 110 is stretched, a voltage of the sensing line part 150 may not be changed. Because the signal wire of the pixel element 111 and the sensing line part 150 are changed to a short-circuited state after the substrate part 110 is stretched, a voltage of the sensing line part 150 may be changed. Furthermore, the sensing line part 150 may be connected with the signal wire of the pixel element 111 through a capacitor, and a capacitance of the sensing line part 150 may be changed after the substrate part 110 is stretched.

The stretching state detection part 170 may detect a stretching state of the substrate part 110 based on a change in voltage or capacitance of the sensing line part 150 according to stretch of the substrate part 110. In other words, as a distance between the pixel element 111 formed on the substrate part 110 and the sensing line part 150 is changed according to the stretch of the substrate part 110, when a change in voltage or capacitance of the sensing line part 150 is detected, the stretching state detection part 170 may detect a stretching state of the substrate part 110 based on the detected change in voltage or capacitance of the sensing line part 150 using stretching state information for each predetermined voltage or capacitance.

Herein, the stretching state information for each predetermined voltage or capacitance may include information about a voltage value or a capacitance value for each stretching degree according to a stretching degree of the substrate part 110. For example, before the substrate part 110 is stretched, as shown in FIG. 11, the pixel element 111 formed on the substrate part 110 and the sensing line part 150 are away from each other. When the substrate part 110 is stretched, as shown in FIG. 12, the pixel element 111 formed on the substrate part 110 and the sensing line part 150 are close to each other.

Due to this, a voltage or capacitance of the sensing line part 150 may be changed. The stretching state detection part 170 may detect a stretching state of the substrate part 110 based on the change in voltage or capacitance of the sensing line part 150. Then, a description will be given in detail of an operation of a stretchable display device according to a preferred embodiment of the inventive concept with reference to FIGS. 13 and 14.

Figure 13:
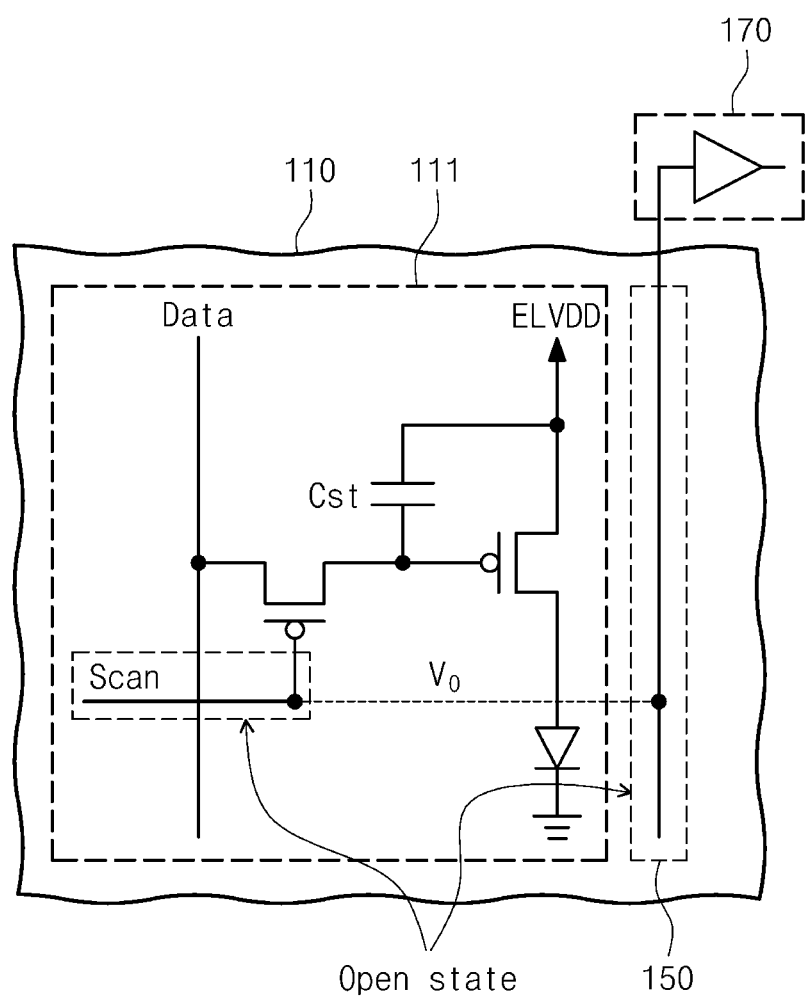
FIGS. 13 and 14 are drawings for describing an example of a stretchable display device illustrated in FIG. 11.
Figure 14:
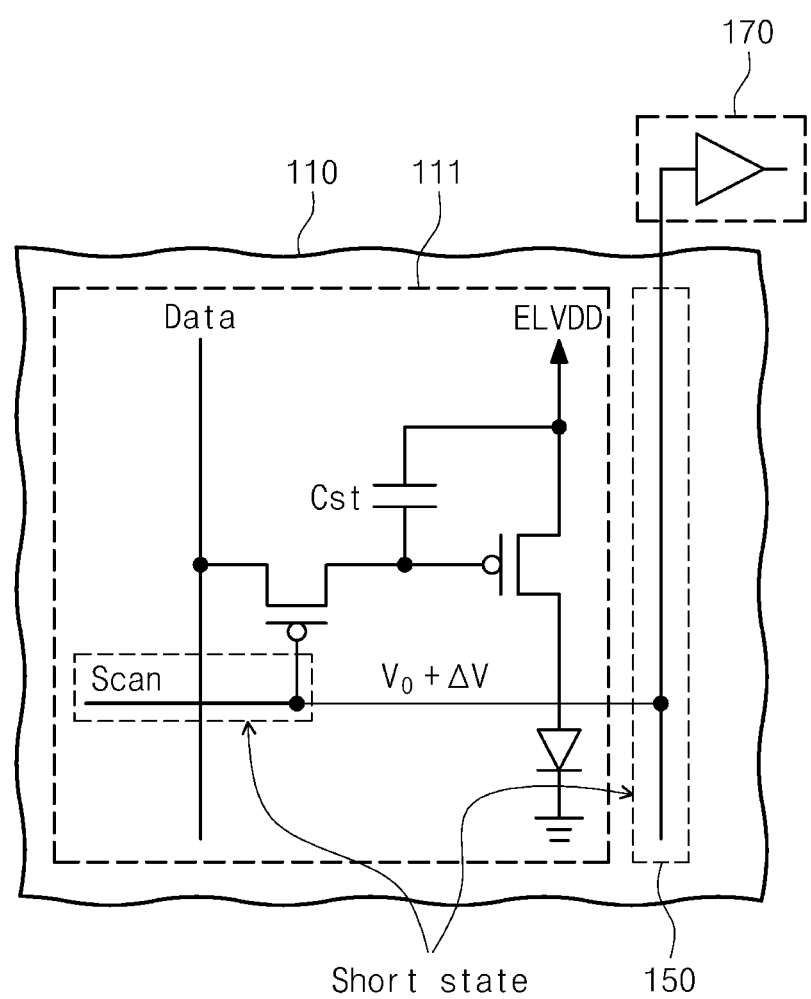

FIGS. 13 and 14 are drawings for describing an operation of a stretchable display device illustrated in FIG. 11. Before a substrate part 110 is stretched, as shown in FIG. 13, because a signal wire of a pixel element 111 formed on the substrate part 110 and a sensing line part 150 are opened, a voltage of the sensing line part 150 is not changed. Thereafter, when the substrate part 110 is stretched, as shown in FIG. 14, the signal wire of the pixel element 111 formed on the substrate part 110 and the sensing line part 150 are changed to a short-circuited state. Due to this, a voltage of the sensing line part 150 is changed.

Figure 15:
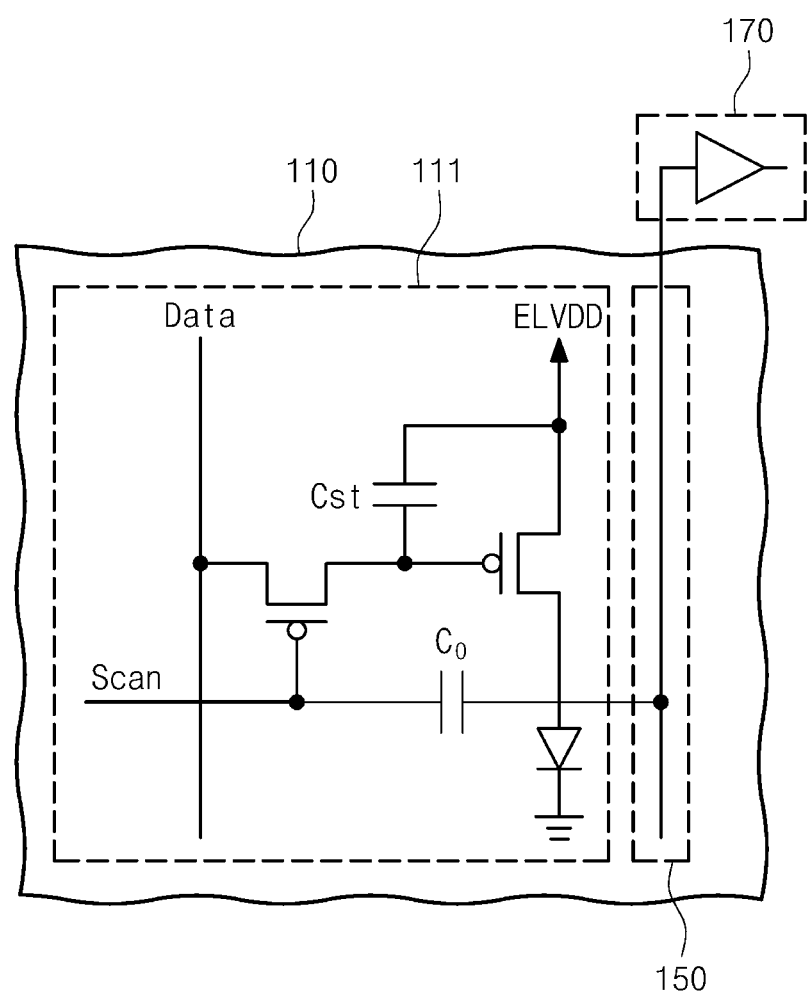
FIGS. 15 and 16 are drawings for describing another example of a stretchable display device illustrated in FIG. 12.
Figure 16:
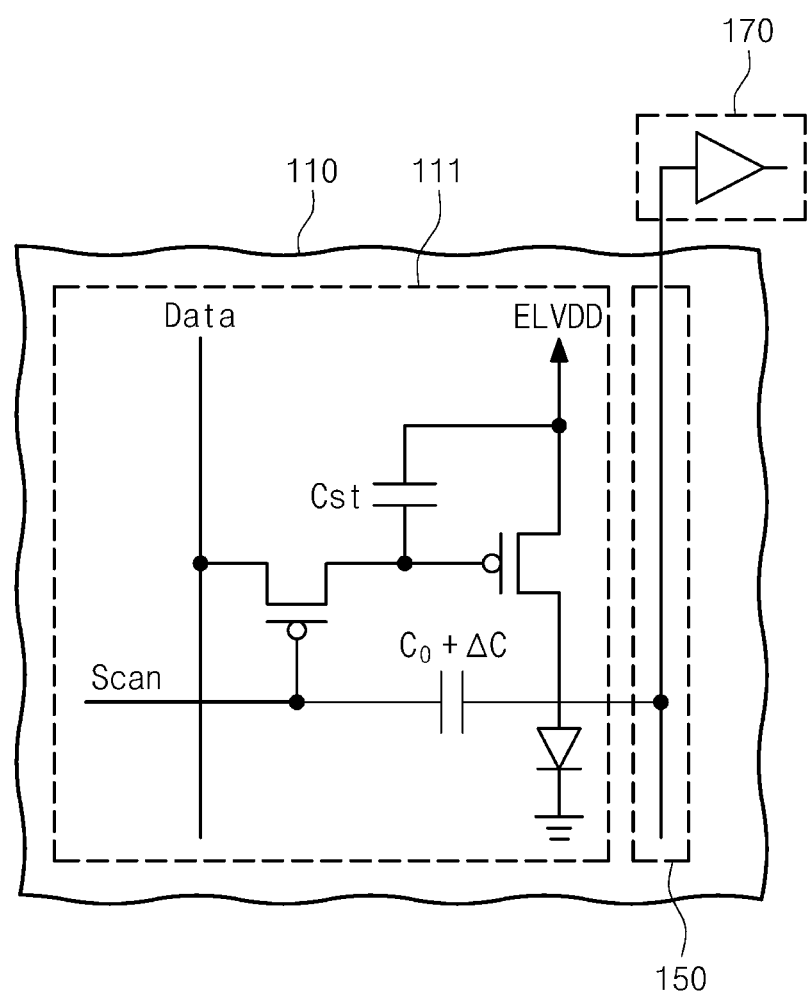

FIGS. 15 and 16 are drawings for describing another example of a stretchable display device illustrated in FIG. 12. FIGS. 15 and 16 are drawings for describing an operation another example of a stretchable display device illustrated in FIG. 10. In a state where a sensing line part 150 is connected with a signal wire of a pixel element 111 formed on a substrate part 110 through a capacitor as shown in FIG. 15, when the substrate part 110 is stretched, as shown in FIG. 16, a capacitance of the sensing line part 150 is changed.

According to embodiments of FIGS. 10 to 16, the stretchable substrate of a wrinkle substrate structure may be formed in a lower portion of the sensing line part 150 and the deformation switch parts may be formed in concave portions on the stretchable substrate to implement the stretchable display device. According to the present embodiment, because an electrical contact point is formed between the stretchable substrate (a wrinkle substrate) of the substrate part 110 and the sensing line part 150, a stable element characteristic may be ensured because the electrical contact is not exposed to the outside, and a manufacturing process of the stretchable substrate and the deformation switches may be facilitated.

Figure 17:
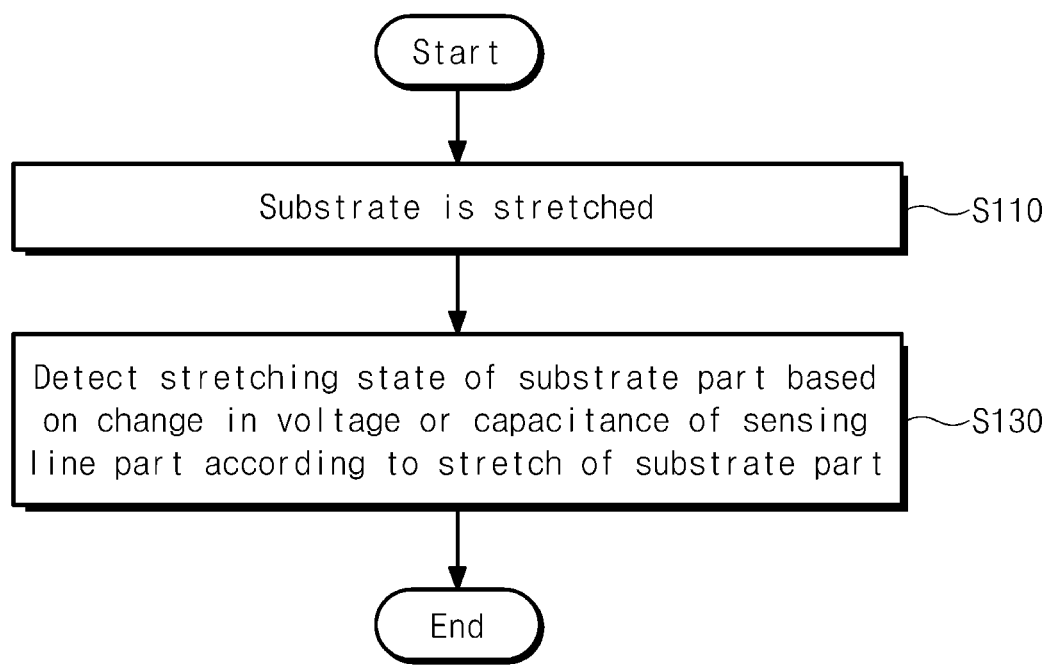
FIG. 17 is a flowchart for describing a method for detecting a stretching state of a stretchable display device according to an embodiment of the inventive concept.

Hereinafter, a description will be given of a method for detecting a stretching state of a stretchable display device according to a preferred embodiment of the inventive concept with reference to FIG. 17. FIG. 17 is a flowchart for describing a method for detecting a stretching state of a stretchable display device according to a preferred embodiment of the inventive concept. Referring to FIG. 17, in operation S110, a substrate part 110 of a stretchable display device 100 may be stretched by an operation of a user. Herein, the substrate part 110 may be implemented in a pre-stretch scheme to have a wavy structure and may include a plurality of pixel elements 111 formed on the substrate part 110.

Thereafter, the stretchable display device 100 may detect a stretching state of the substrate part 110 based on a change in voltage or capacitance of a sensing line part 150 located at an upper side of the substrate part 110 according to stretch of the substrate part 110. Herein, the sensing line part 150 may be connected with a signal wire of each of the plurality of pixel elements 111 formed on the substrate part 110.

In other words, because the signal wire of the pixel element 111 and the sensing line part 150 are opened before the substrate part 110 is stretched, a voltage of the sensing line part 150 may not be changed. Because the signal wire of the pixel element 111 and the sensing line part 150 are changed to a short-circuited state after the substrate part 110 is stretched, a voltage of the sensing line part 150 may be changed. Furthermore, the sensing line part 150 may be connected with the signal wire of the pixel element 111 through a capacitor, and a capacitance of the sensing line part 150 may be changed after the substrate part 110 is stretched.

As a distance between the pixel element 111 formed on the substrate part 110 and the sensing line part 150 is changed according to the stretch of the substrate part 110, when a change in voltage or capacitance of the sensing line part 150 is detected, the stretchable display device 100 may detect a stretching state of the substrate part 110 based on the detected change in voltage or capacitance of the sensing line part 150 using stretching state information for each predetermined voltage or capacitance.

Meanwhile, it is described that the one sensing line part 150 according to an embodiment of the inventive concept is located at the upper side of the substrate part 110, that is, that the one sensing line part 150 is connected with the signal wire of each of the plurality of pixel elements 111 formed on the substrate part 110, but the inventive concept is not limited thereto. According to an embodiment, a plurality of sensing line parts 150 may be located at the upper side of the substrate part 110.

For example, the first sensing line part 150 may be located on an upper left surface of the substrate part 110, and the second sensing line part 150 may be located at an upper right surface of the substrate part 110. The first sensing line part 150 may detect a stretching state of the left surface of the substrate part 110, and the second sensing line part 150 may detect a stretching state of the right surface of the substrate part 110.

In this case, the first sensing line part 150 may be connected with signal wires of the plurality of pixel elements 111 located on the left surface of the substrate part 110, and the second sensing line part 150 may be connected with signal wires of the plurality of pixel elements 111 located on the right surface of the substrate part 110. Thus, a stretching state of the substrate part 110 according to the stretch of the substrate part 110 may be detected for each area (or each left surface or each right surface).

Furthermore, when the substrate part 110 is composed of the first substrate part 110 of an area which is not stretched and the second substrate part 110 of an area which is stretched, the one sensing line part 150 according to an embodiment of the inventive concept may be located at an upper side of the second substrate part 110. In other words, the one sensing line part 150 may be connected with a signal wire of each of the plurality of pixel elements 111 formed on the second substrate part 110. Of course, the plurality of sensing line parts 150 may be located at an upper side of the second substrate part 110. Thus, the plurality of sensing line parts 150 may detect a stretching state for only an area which is stretched in the entire area of the substrate part 110.

In the above, even though all elements constituting an embodiment of the inventive concept are described as being combined to one or operating in combination, the inventive concept is not necessarily limited to the embodiment. That is, all the elements may also be selectively combined and operated with each other as one or more elements without departing from the scope of the inventive concept. In addition, although each of all the elements may be implemented by one independent hardware, some or all of the respective elements which are selectively combined with each other may be implemented by a computer program having a program module performing some or all of functions combined with each other in one or plural hardware. Furthermore, such a computer program may be stored in computer readable media such as a USB memory, a CD disk, or a flash memory and may be read and executed by the computer to implement an embodiment of the inventive concept. The computer readable media may include magnetic storage media, optical storage media, or the like.

According to an embodiment of the inventive concept, the stretchable display device may be provided to correct display resolution and luminance depending on a stretching degree applied to a stretchable substrate.

Furthermore, according to an embodiment of the inventive concept, the stretchable display device may adjust display resolution and luminance without the necessity of a separate strain sensor or a switch which operates by a control signal.

Furthermore, according to an embodiment of the inventive concept, the stretchable display device may implement a display depending on a stretching state of a substrate having a wavy structure based on a sensing line disposed on the substrate and may proceed with detecting stretch for each pixel, thus much more precisely detecting stretch and supplementing resolution and luminance.

While a few embodiments have been shown and described with reference to the accompanying drawings, it will be apparent to those skilled in the art that various modifications and variations can be made from the foregoing descriptions. Therefore, other implements, other embodiments, and equivalents to claims are within the scope of the following claims.

What is claimed is:

1. A stretchable display device, comprising:
   a stretchable substrate;
   first light emitting pixels spaced apart from each other on the stretchable substrate, each of the first light emitting pixels including a first light emitting element;
   deformation switch straps arranged between the first light emitting pixels on the stretchable substrate and stretched and deformed according to stretch of the stretchable substrate; and
   second light emitting pixels arranged between the first light emitting pixels on the stretchable substrate, each of the second light emitting pixels including a second light emitting element,
   wherein the first light emitting pixels are fixed to an upper surface of the stretchable substrate,
   wherein each of the deformation switch straps has a dome shape and each of the second light emitting pixels is fixed to an upper surface of a corresponding deformation switch strap,
   wherein each of the second light emitting pixels emits light only when the corresponding deformation switch strap is fully stretched,
   wherein both ends of each deformation switch strap are directly fixed to the upper surface of the stretchable substrate.

2. The stretchable display device of claim 1, wherein each of the deformation switch straps has an electrical contact point having conductivity,
   wherein each of the second light emitting pixels has a pixel contact point having conductivity,
   wherein each of the deformation switch straps is deformed such that the electrical contact point moves between a first position being a position where the electrical contact point is spaced apart from the pixel contact point and a second position being a position where the electrical contact point is in contact with the pixel contact point depending on stretch of the stretchable substrate, and
   wherein each of the second light emitting pixels is controlled to emit light depending on whether there is a contact between the electrical contact point and the pixel contact point or is controlled to emit light depending on a change in resistance and/or capacitance according to deformation of each of the deformation switch straps.

3. The stretchable display device of claim 2, wherein each of the deformation switch straps is electrically connected with at least one of a light emitting element, an active element, a passive element, and a power wire part of each of the second light emitting pixels.

4. The stretchable display device of claim 2, wherein a middle area between the ends of each of the deformation switch straps is spaced apart from the upper surface of the stretchable substrate in a state where the stretchable substrate is not stretched.

5. The stretchable display device of claim 1, wherein the deformation switch straps include:
   a first deformation switch strap having a first stretching rate; and
   a second deformation switch strap having a second stretching rate different from the first stretching rate.

6. The stretchable display device of claim 5, wherein a first electrical contact point of the first deformation switch strap switches from a non-contact state to a contact state with a first pixel contact point, when a first stretching force is applied to the stretchable substrate,
   wherein a second electrical contact point of the second deformation switch strap is maintained in a non-contact state with a second pixel contact point, when the first stretching force is applied to the stretchable substrate, and
   wherein the second electrical contact point of the second deformation switch strap switches to a contact state with the second pixel contact point, when a second stretching force greater than the first stretching force is applied to the stretchable substrate.

7. The stretchable display device of claim 2, further comprising:
   a power wire part formed on the stretchable substrate and configured to apply power,
   wherein the pixel contact point is an area corresponding to a lower position of the electrical contact point of each of the deformation switch straps in the power wire part.

8. The stretchable display device of claim 7, wherein each of the second light emitting pixels further includes:
   a first transistor driven according to scan power applied through a scan line; and
   a second transistor configured to supply power applied through the power wire part to the second light emitting element depending on data power applied through a data line, when the first transistor is driven, and
   wherein each of the deformation switch straps is electrically connected with a first node corresponding to a drain terminal or a source terminal of the second transistor when the electrical contact point is at the second position.

9. The stretchable display device of claim 2, wherein each of the second light emitting pixels further includes:
   a first transistor driven according to scan power applied through a scan line; and
   a second transistor configured to supply power applied through a power wire part to the second light emitting element depending on data power applied through a data line, when the first transistor is driven, and
   wherein a first node corresponding to any one of a drain terminal or a source terminal of the second transistor is electrically connected with the power wire part, and
   wherein each of the deformation switch straps is electrically connected with the second light emitting element.

10. The stretchable display device of claim 9, wherein a pixel circuit part including the first transistor and the second transistor is formed on the upper surface of the stretchable substrate.

11. The stretchable display device of claim 10, wherein the first node corresponding to the any one of the drain terminal or the source terminal of the second transistor is electrically connected with the power wire part, and
    wherein the pixel contact point is a second node corresponding to the other of the drain terminal or the source terminal of the second transistor.

12. The stretchable display device of claim 11, wherein the second light emitting pixel is electrically short-circuited with the pixel circuit part in a state where the stretchable substrate is not stretched, and is electrically connected with the pixel circuit part through each of the deformation switch straps, in a state where the stretchable substrate is stretched and where the electrical contact point is in contact with the pixel contact point.

13. The stretchable display device of claim 1, wherein the deformation switch straps include a first deformation switch strap and a second deformation switch strap, each of which has a different stretching rate, and
    wherein the first deformation switch strap and the second deformation switch strap have different sizes, have different shapes, or are formed of different materials.

14. The stretchable display device of claim 1, wherein the number of pixels which emit light among the second light emitting pixels is changed according to a stretching force applied to the stretchable substrate.

15. The stretchable display device of claim 1, wherein the deformation switch straps are arranged in the form of a grid.

16. A stretchable display device, comprising:
    a stretchable substrate;
    first light emitting pixels spaced apart from each other on the stretchable substrate, each of the first light emitting pixels including a first light emitting element;
    deformation switch straps arranged between the first light emitting pixels on the stretchable substrate and having electrical contact points, each of which has conductivity; and
    second light emitting pixels arranged between the first light emitting pixels on the stretchable substrate and having pixel contact points, each of which has conductivity, each of the second light emitting pixels including a second light emitting element, and
    wherein the deformation switch straps are provided to be deformable such that each of the electrical contact points moves from a first position to a second position,
    wherein the first position is a position where each of the electrical contact points is spaced apart from the corresponding pixel contact point,
    wherein the second position is a position where each of the electrical contact points is in contact with the corresponding pixel contact point,
    wherein the first light emitting pixels are fixed to an upper surface of the stretchable substrate,
    wherein each of the deformation switch straps has a dome shape and each of the second light emitting pixels is fixed to an upper surface of a corresponding deformation switch strap,
    wherein each of the second light emitting pixels emits light only when the corresponding deformation strap is fully stretched,
    wherein both ends of each deformation switch strap are directly fixed to the upper surface of the stretchable substrate.

17. The stretchable display device of claim 16, wherein each of the deformation switch straps is disposed in a convex shape, and wherein each of the second light emitting pixels is controlled to emit light depending on whether there is a contact between each of the electrical contact points and the corresponding pixel contact point according to physical deformation of each of the deformation switch straps.

18. The stretchable display device of claim 16, wherein an upper surface of each of the pixel contact points is the same in height as the upper surface of the stretchable substrate or is higher in height than the upper surface of the stretchable substrate.

\* \* \* \* \*